United States Patent [19]

Lee

[11] Patent Number: 4,679,142

[45] Date of Patent: Jul. 7, 1987

[54] RADIOACTIVE MATERIAL BILLING SYSTEM AND METHOD

[75] Inventor: Denny L. Y. Lee, Andover, Mass.

[73] Assignee: E.I. du Pont de Nemours and Company, Wilmington, Del.

[21] Appl. No.: 627,867

[22] Filed: Jul. 2, 1984

[51] Int. Cl.[4] ...................... G01R 21/00; G06F 15/20; G06F 15/24

[52] U.S. Cl. .................................... 364/406; 340/825; 340/870.07; 250/432 PD; 250/328

[58] Field of Search ............ 250/328, 361 R, 432 PD; 364/406, 413, 414, 446; 340/825, 31-34, 870.07

[56] References Cited

U.S. PATENT DOCUMENTS 3,246,150 4/1966 Stoddart .............................. 250/328
3,678,148 7/1972 Caiola ................................ 424/250
3,920,995 11/1975 Czaplinski .................... 250/432 PD
4,291,375 9/1981 Wolf ................................... 364/464

FOREIGN PATENT DOCUMENTS 0127386 10/1979 Japan .................................. 250/328

OTHER PUBLICATIONS

"ICS" Isotope Computer System, Victoreen, Inc., Cleveland, Ohio.

*Primary Examiner*—Jerry Smith
*Assistant Examiner*—G. Hayes

[57] ABSTRACT

Quantities of radioactive material are dispersed at a user location. Billing is accomplished by monitoring the decay of material and the degree of activity following each user withdrawal.

19 Claims, 25 Drawing Figures

900 SUBROUTINE FOR INTERNAL CALIBRATION

LINE NUMBER

1000 CHECK KNOB POSITION SUBROUTINE

LINE NUMBER

2000 WRITE TO FILE SUBROUTINE

3000 TITLE PAGE DISPLAY SUBROUTINE

4000 CAL-CARD ERROR SUBROUTINE

RADIOACTIVE MATERIAL BILLING SYSTEM AND METHOD

BACKGROUND OF THE INVENTION

Radioisotopes, as radiopharmaceuticals, have come into widespread usage in hospitals and the like for diagnostic and other purposes. Once the radioactive material is manufactured it is shipped in multidose containers to the using or distributing site, such as a radio pharmacy, for later dispensing and shipment of prescribed single doses to the ultimate user. This procedure presents little problem except in the case of those isotopes such as thallium, gallium, and technitium which have relatively short half-lives. In the case of thallium-201, for example, which is used in heart imaging, the half-life is in the order of 73 hours. Thus this radioisotope while having a high value in use, i.e., heart studies, is perishable and after manufacture must be shipped quickly to the user before its strength decays below that needed for heart imaging. This necessitates, in many cases, shipment by air which is relatively expensive and does not permit the user to maintain a supply on hand for unanticipated needs. This can create unacceptable delays in performing often urgently needed diagnostic tests.

The radioactive materials could be shipped in larger quantities and stored until the user is ready for them. This presents a problem, however, since one does know how much is used of the material and how the user should be billed for such material used.

SUMMARY OF THE INVENTION

According to the method of this invention, quantities of radioactive material in a container are supplied to a dispenser at a user location together with information on a label card as to the type of radioactive material, calibration date, concentration and total quantity in the container. The user places the container of radioactive material in a shielded chamber attached to a usage recorder in the dispenser. This recorder includes a real time clock, calendar and a radiation detector. The detector measures the received radioactivity of the container and checks it against the label quantity and the information is recorded in a nonvolatile computer memory. Every time the lid of the chamber is opened or closed for the dispensing of the radioactive material, the time and radiation level of the radioactive material in the container is recorded and stored in the nonvolatile memory. At the end of the useful life of the radioactive material, a dilution fluid is injected into the container until the radiation detector means senses that the diluted level of the fluid is now at a useless concentration for medical purposes. The spent radioactive material container may then be removed from the chamber and disposed of in a proper manner. The dispenser then communicates with a billing location to send back information as to actual radioisotope usage for billing the user and the user is billed.

In this manner, the larger quantities of radioactive material may be sent, thereby lowering the transportation costs which is significant particularly with short half-life radioactive materials. Thus the user may be charged on a timely basis only for the quantity of isotope or radioactive material they actually used.

The invention also provides a system for effecting billing from a billing location based on the actual usage of radioactive material held in a dispensing container at a user location. The system comprises a radiation-shielded chamber adapted to receive the container at a user location, a sensor for providing a signal each time the chamber is accessed, a detector means for detecting radiation emitted from the container while in the chamber, a control unit responsive to the sensor and detector means for measuring the level of radiation emitted from the container (a) periodically and (b) each time the chamber is accessed, memory means responsive to the control unit for storing each of the radiation measurements together with the time of the access event, and billing means responsive to the control unit and memory means for calculating the radioactive material actually removed from the container based on the periodic and access measurements.

The system also includes an identification member for each container holding information as to the type of material and shipped radiation level of that container, reader means for ascertaining the information in such member, and means responsive to the reader means for transferring such information to the control unit to determine if the initial radiation level in the container is appropriate based on the shipped radiation level. The detector means includes means for measuring the radiation emitted from the lower portion of the chamber and means for measuring the radiation emitted from the upper portion of the chamber, the control unit being responsive to the radiation emitted from the upper portion of the chamber being greater than a predetermined level to signal a spent container and discontinue measuring radiation emitted from the container.

The user is prevented from cheating—he must dilute and render the radioactive material useless for medical purposes or be billed for the material. Both user and supplier save since the high transportation costs are reduced and the user benefits by always having a supply of material on hand.

BRIEF DESCRIPTION OF THE DRAWINGS

The detailed operation of the method and system described briefly above can be best understood by reference to the following drawings in which.

DETAILED DESCRIPTION OF THE PREFERRED EMBODIMENT

Figure 1:
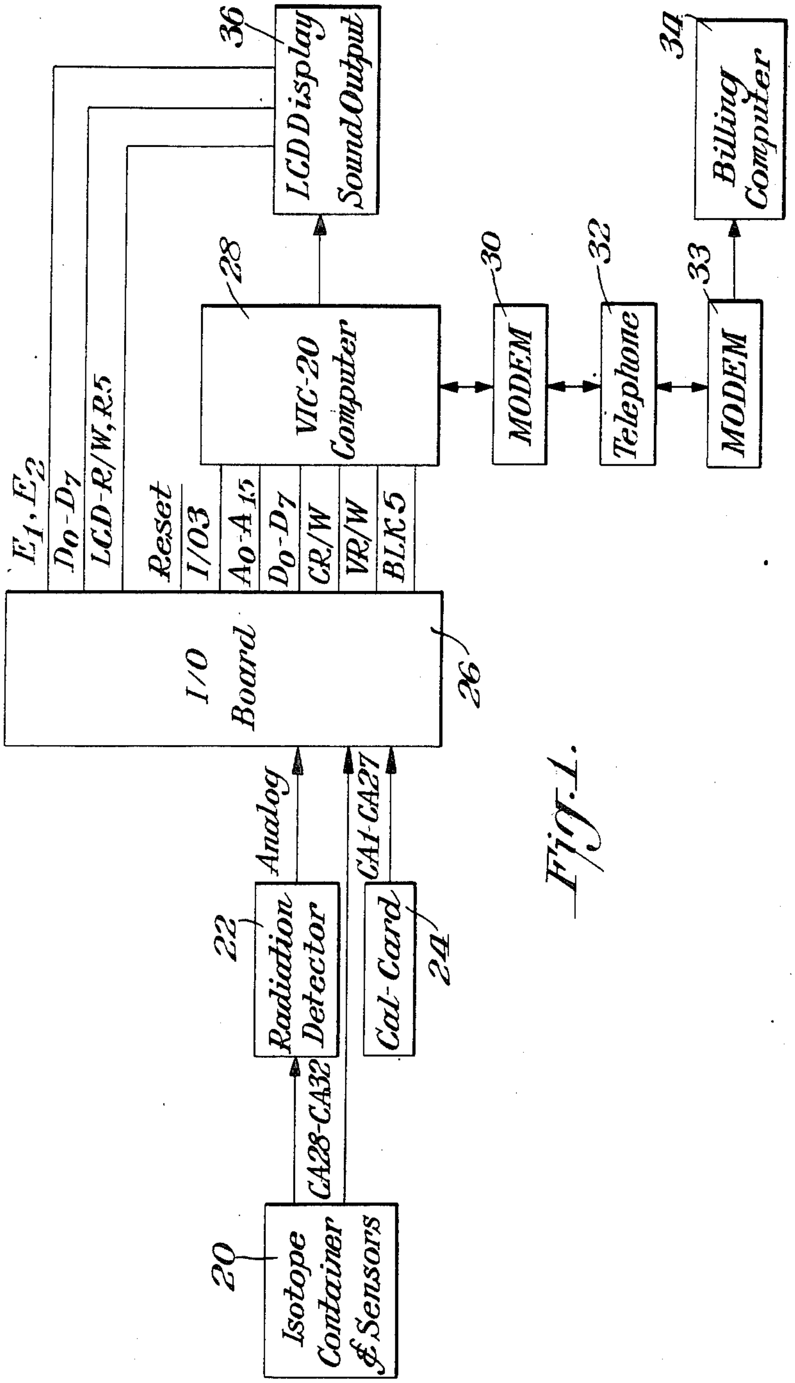
FIG. 1 is a block diagram of the system of this invention constructed in accordance with a preferred embodiment of this invention.

Thus the system includes as may be seen in FIG. 1, a radioactive material container and sensors 20, a radiation detector 22 located immediately below the container 20, as is seen more clearly in FIGS. 2–6, and a calibration card designated CAL-CARD 24. The output of the radiation detector 22 which is an analog signal together with digital outputs CA28 to 32 from the isotope containers and sensor and digital outputs CA1 to 27 from the CAL-CARD are all coupled to the I/O circuit board 26. The I/O circuit board, as will be more particularly described, contains a 6-K PROM automatic start program, a 2-K CMOS RAM data storage, a real time clock, an 8-BIT analog to digital converter, a 32-BIT input and an 8-BIT output, and provides digital output signals, $E_1$, $E_2$, $D_0$–$D_7$, and LCD-R/W and R5 signals to a liquid crystal display (LCD) and sound output device 36. In addition it provides a number of digital signals including reset, I/03, $A_0$–$A_{15}$, $D_0$–$D_7$, CR/W, VR/W and BLK5 to a computer 28. Although any computer may be used for this purpose, a VIC 20 computer has been found entirely satisfactory. The output of the computer is also coupled to the LCD display 36 and to a modem 30 which of course may be plugged to a telephone 32 for transmittal back through a receiving end modem 33 to a billing location 34.

The isotope container and sensors 20 are best illustrated in FIGS. 2–6.

Figure 3:
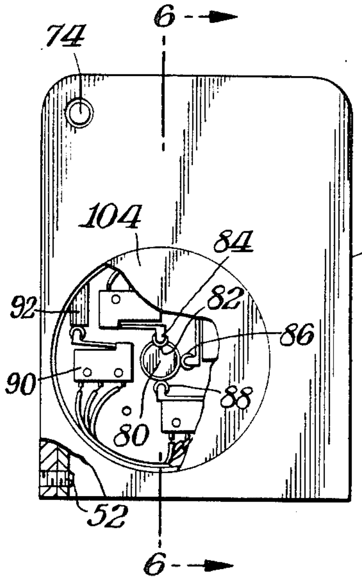
Figure 2:
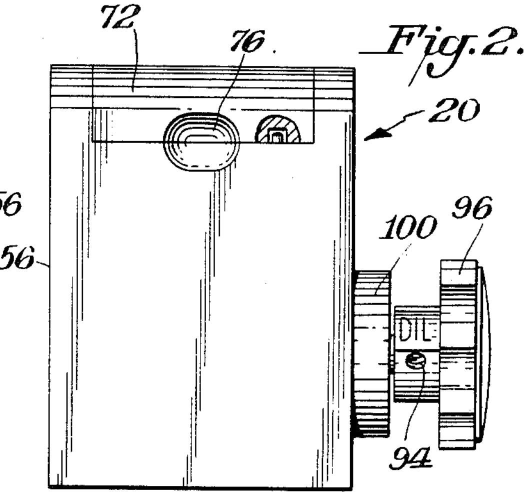
Figure 5:
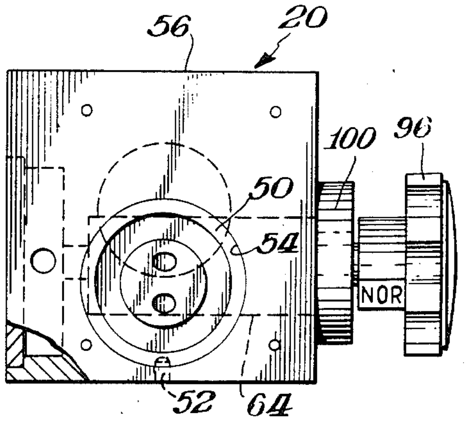
Figures 7, 7A:
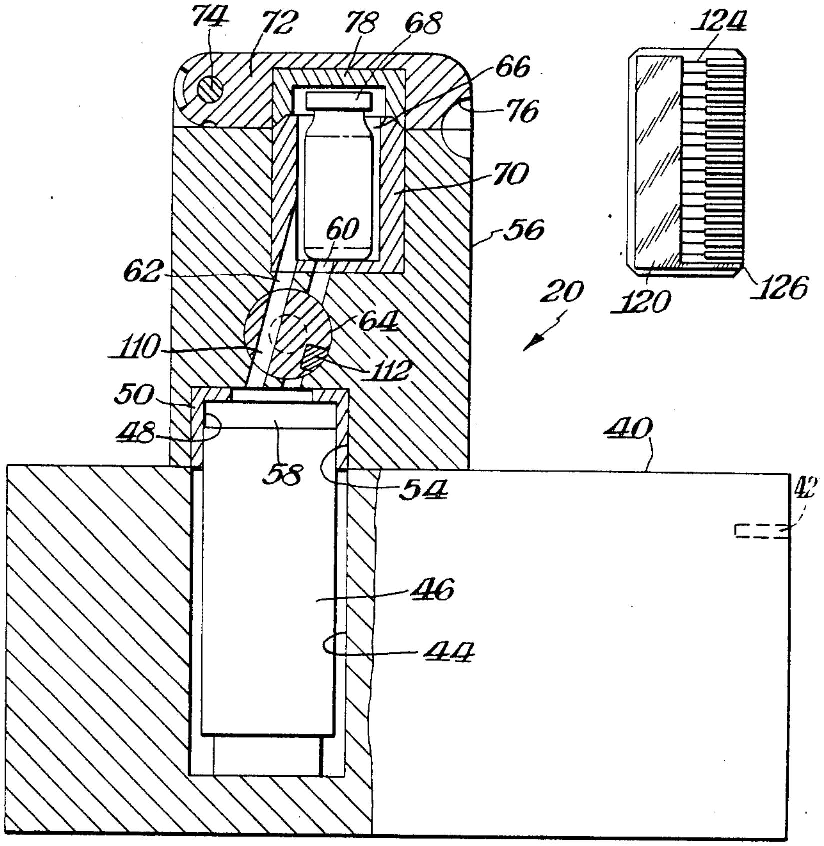
FIG. 7 is an elevation view partially cut away of the complete dispenser including a housing for the I/O board.
FIG. 7A is a plan view of the CAL CARD used with the I/O board.
Figure 9:
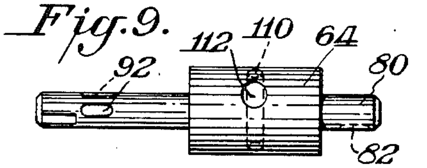
FIGS. 8 through 10 are plan, elevation of and end views of the drum used in the dispensing unit of FIGS. 2–6.
Figure 8:
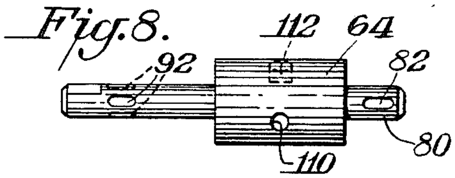
Figure 10:
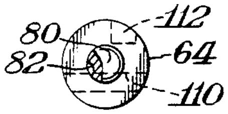

The dispenser is seen in an elevation view partially cut away most clearly in FIG. 7. In this figure the dispenser is seen to include a base member 40 in which is housed the I/O board 26 (shown in FIGS. 11A & 11B) a slot 42 into which the CAL-CARD 24 may be inserted to be plugged into the I/O board 26. A cavity 44 is provided for a photomultiplier tube 46. The photomultiplier tube 46 extends upwardly out of the base member 40 and into the lower portion of a shielded chamber 48. The shielded chamber is shielded by a shield 50 which is held by a set screw 52 in a cavity 54 formed in a dispenser block 56. A sodium iodide or similar crystal 58 is positioned in the upper portion of the cavity 48. The top of the shield 50 is open and communicates with two bores 60 and 62. The bores 60 and 62 are interrupted by a rotary drum 64. The bores 60 and 62 extend respectively into the lower portion of a shielded cavity 66 adapted to receive a container 68 of radioactive material. The first bore 60 extends into the bottom of that cavity and the second bore 62 extends upward to a point along the side wall of the cavity. The cavity itself is defined by a shield member 70 and a lid 72 which pivots at 74 so that it may be opened easily by a finger indentation 76. The inside of the lid 72 also has a shield member 78 to prevent radiation from the material in the dispenser 68 from harming users. As seen in FIG. 9, the drum 64 is mounted on a shaft 80, one end of which has a single detent dimple 82 (FIGS. 8–10) adapted to engage any one of three microswitches 84, 86, 88 (FIG. 3). Microswitch 84 provides a CA29 signal to the I/O board; microswitch 86 provides the normal signal CA28 to the I/O board; and microswitch 88 provides a CA30 signal denoting CALIBRATE to the I/O board. A fourth microswitch 90 is connected to be operated by a sensing rod 92.

Figure 4:
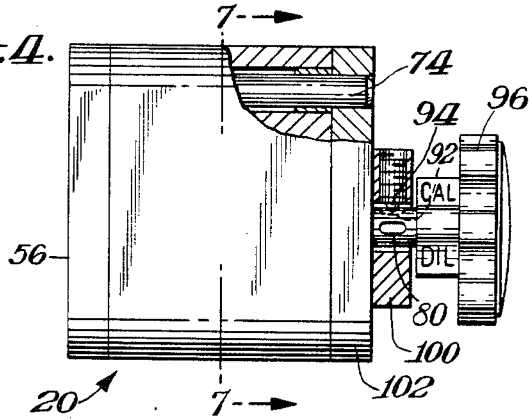
FIGS. 2 through 6 are various views of the dispensing unit constructed in accordance with this invention.
Figure 6:
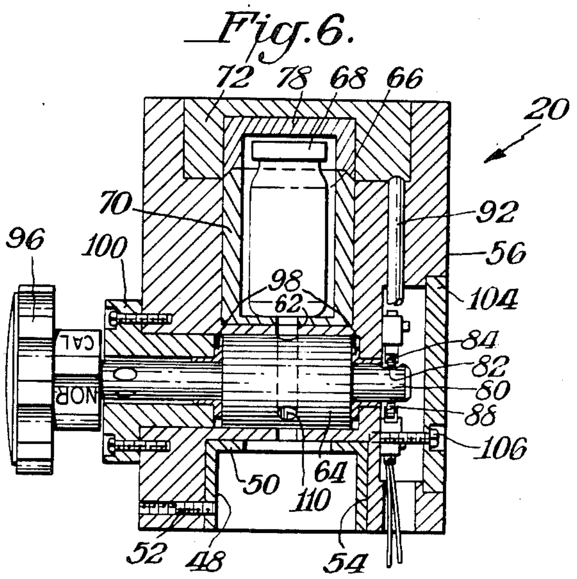

The other end of the shaft 80 has three detent dimples 93 adapted to engage detent 94 (FIG. 4). The three locations correspond to positions on a KNOB 96 (FIG. 4), connected to the other end of the shaft 80, of calibrate, dilute and normal. The shaft 80 is mounted by sleeve bearings 98 (FIG. 6) and a sleeve 100 held by screws to the block 56 which forms the dispensing unit housing. The microswitches are accessed by a rmovable panel 104 held by a screw 106 (FIG. 6). The drum 64 has an offset bore 110 which is in alignment with one of the bores 62, as seen in FIG. 7, and upon rotation of shaft 80, 180° is in alignment with the remaining bore 60. Positioned at approximately 90° around the shaft from the bore 110 is a receptacle holding a calibration source 112 of radioactive material such as 195Au. This internal calibration source when the KNOB is rotated into the "calibrate" position, will then be directly above the sodium iodide crystal 58.

In the operation of this dispenser, when it is desired to introduce a dispensing container 68 into the cavity 66, one merely lifts the lid 72, inserts the container 68, closes the lid 72, inserts the CAL-CARD in the slot 42 and rotates the KNOB 96 to the "normal" position. The "normal" position is such that the bore 110 is in alignment with base 60 to sense the radiation level in the bottom of the cavity 66. Likewise in the "dilute" position bore 110 is in alignment with bore 62 to measure the radiation level in the mid portion of the chamber, i.e., the portion where the diluted fluid in the container will be. The CAL-CARD itself (FIG. 7A) is simply an edge-board 120 having fusible links 124 connected to ground 126 from edge-board connector contacts 122 on both the top and bottom of one edge of the edge-board. The fusible links are broken as needed to provide "1" or "0" inputs CA1–28 to the I/O circuit 26. The program now takes over, as will be described hereinafter, to make the periodic measurements and calculations as are necessary to the operation of this automatic billing system.

Figure 11A:
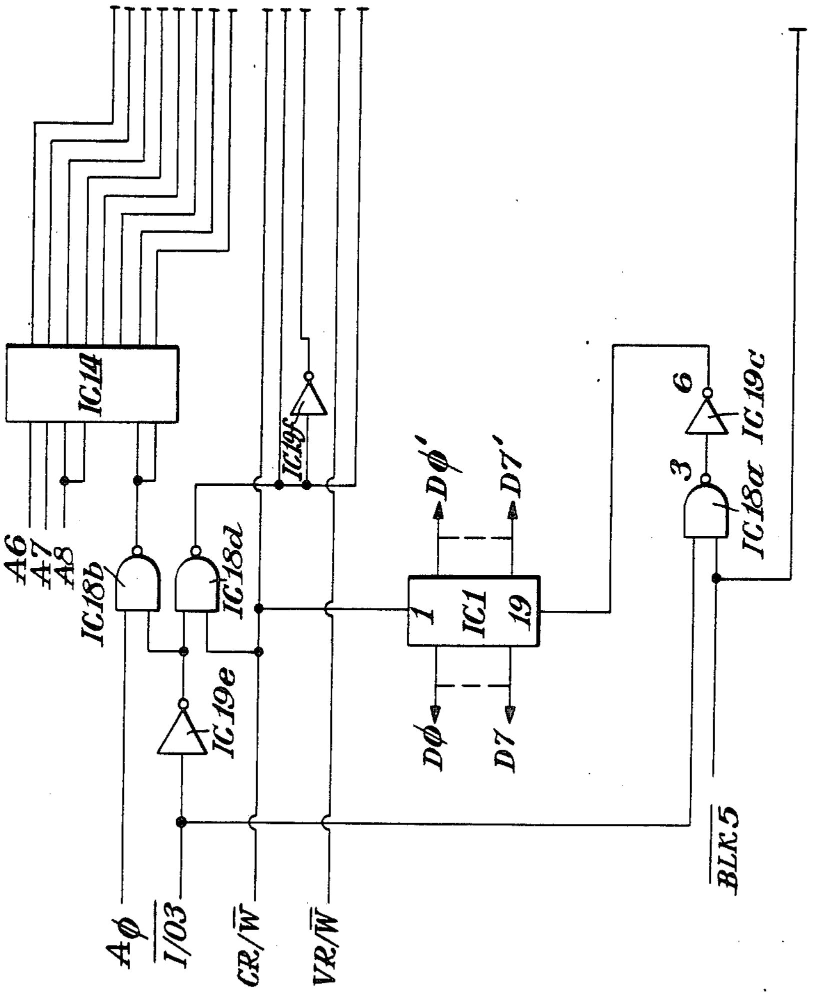
FIG. 11A and 11B are block schematic diagrams of the I/O board depicted in FIG. 1.
Figure 11B:
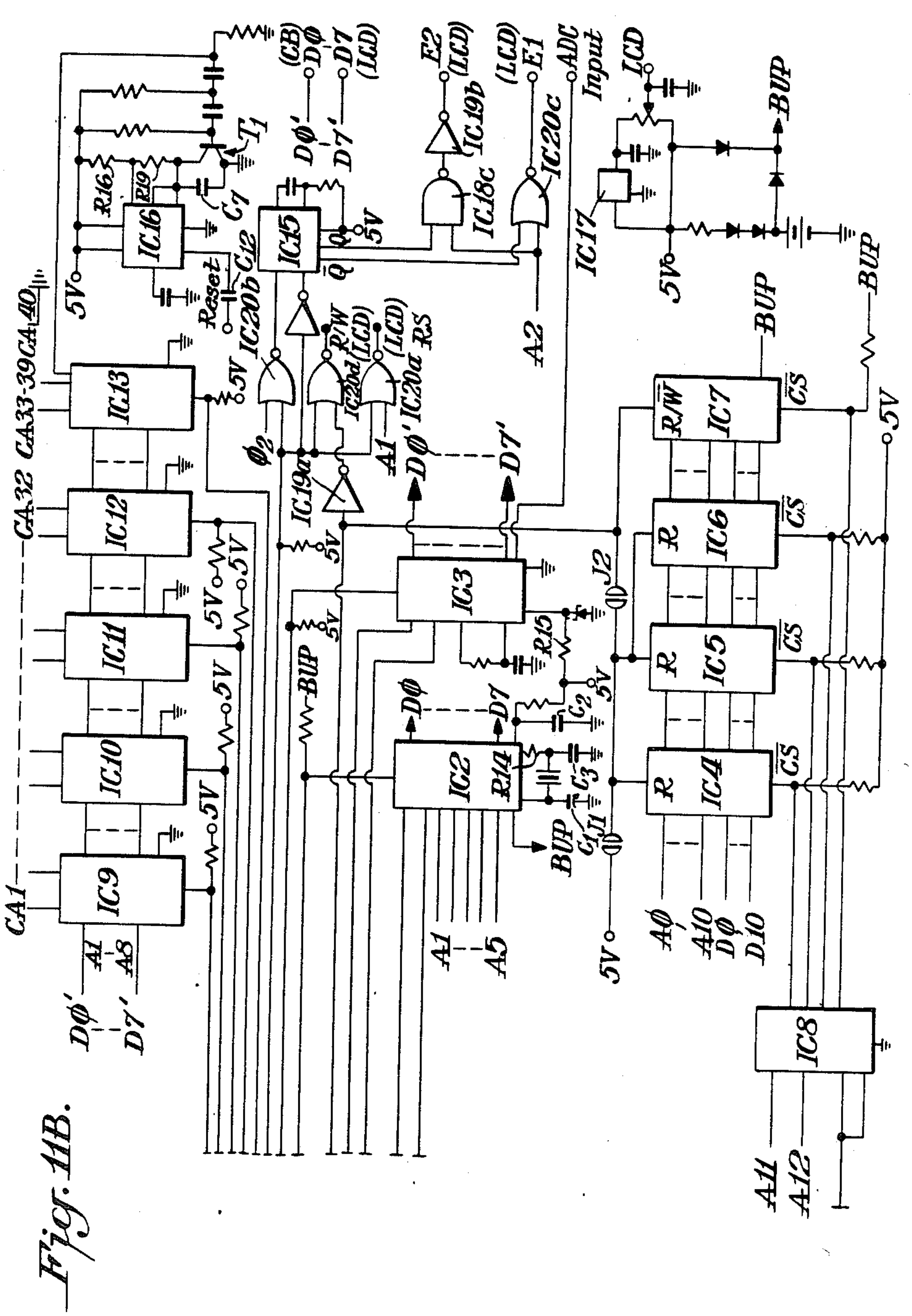
Figure 12A:
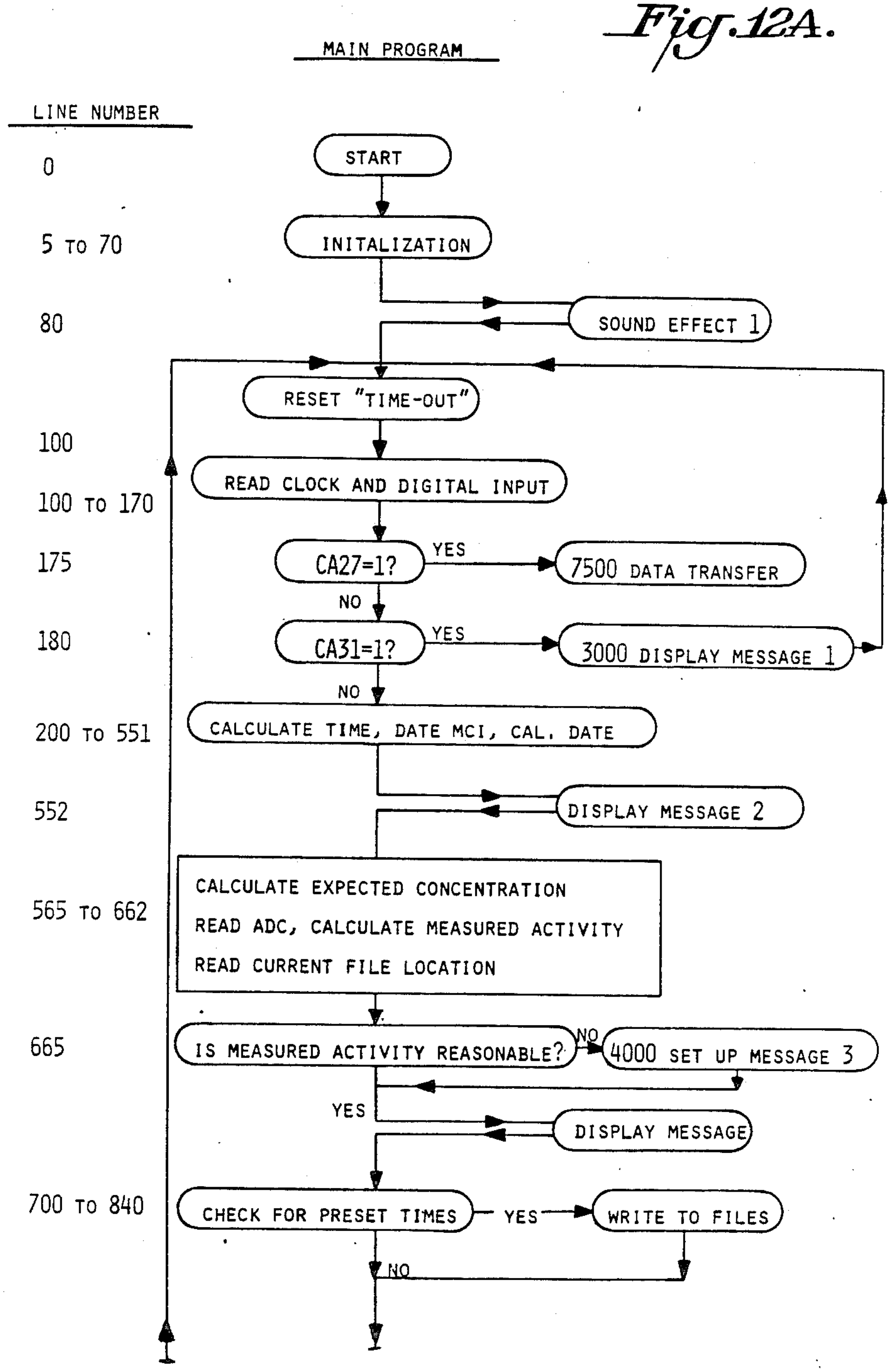
FIGS. 12 through 19 are flow charts depicting the various sequences of operation by which the system of this invention functions to record the usage of radioactive materials at user locations.
Figure 12B:
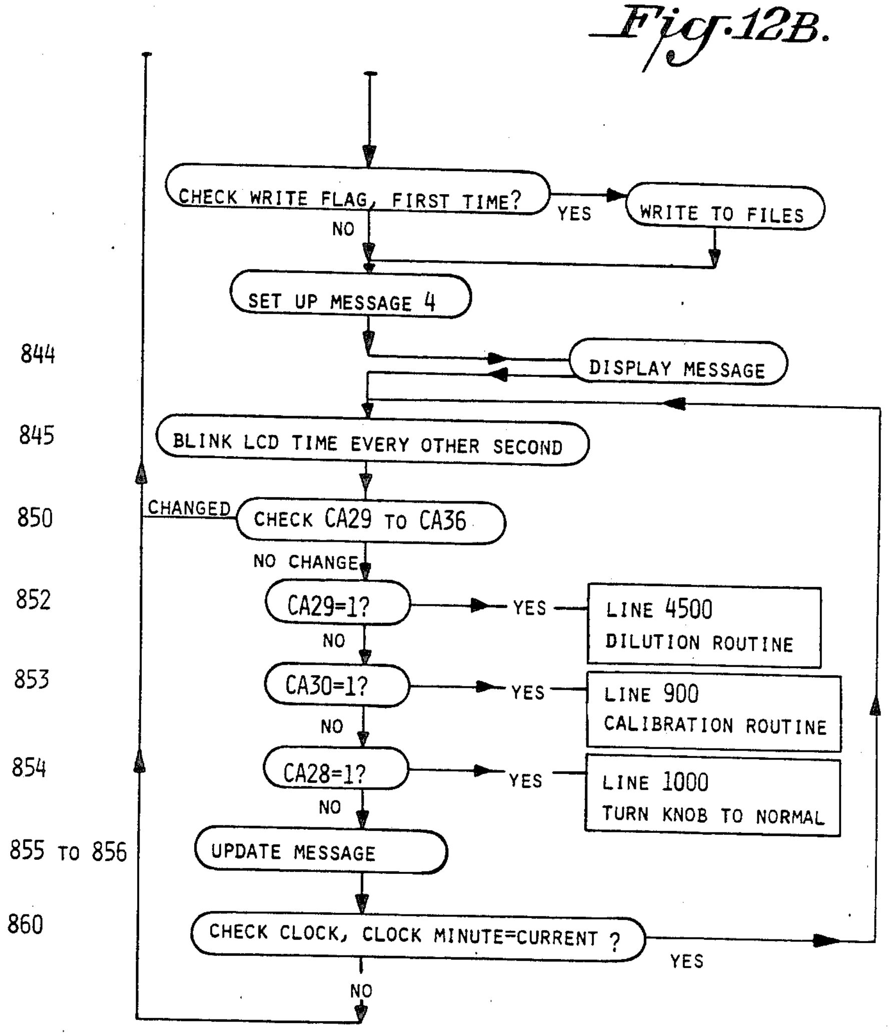
Figure 13:
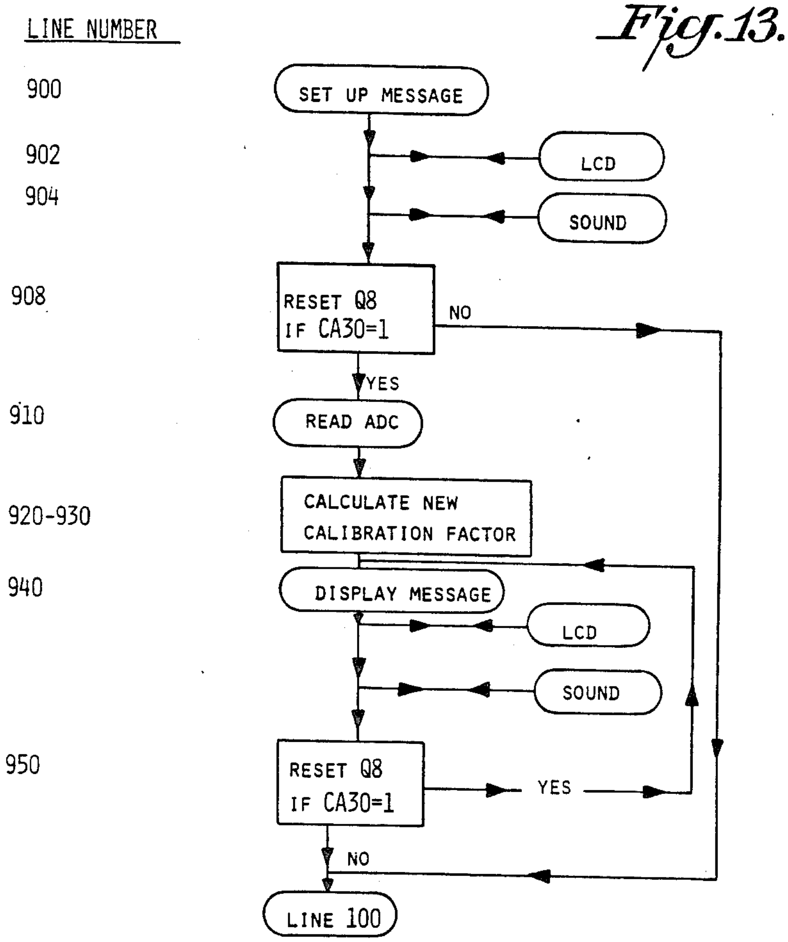
Figure 14:
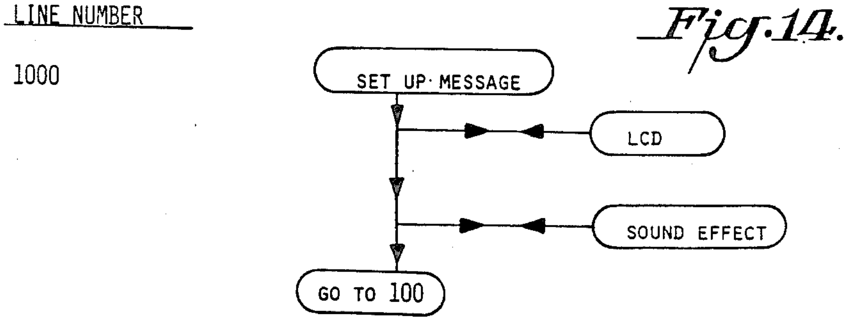
Figure 15:
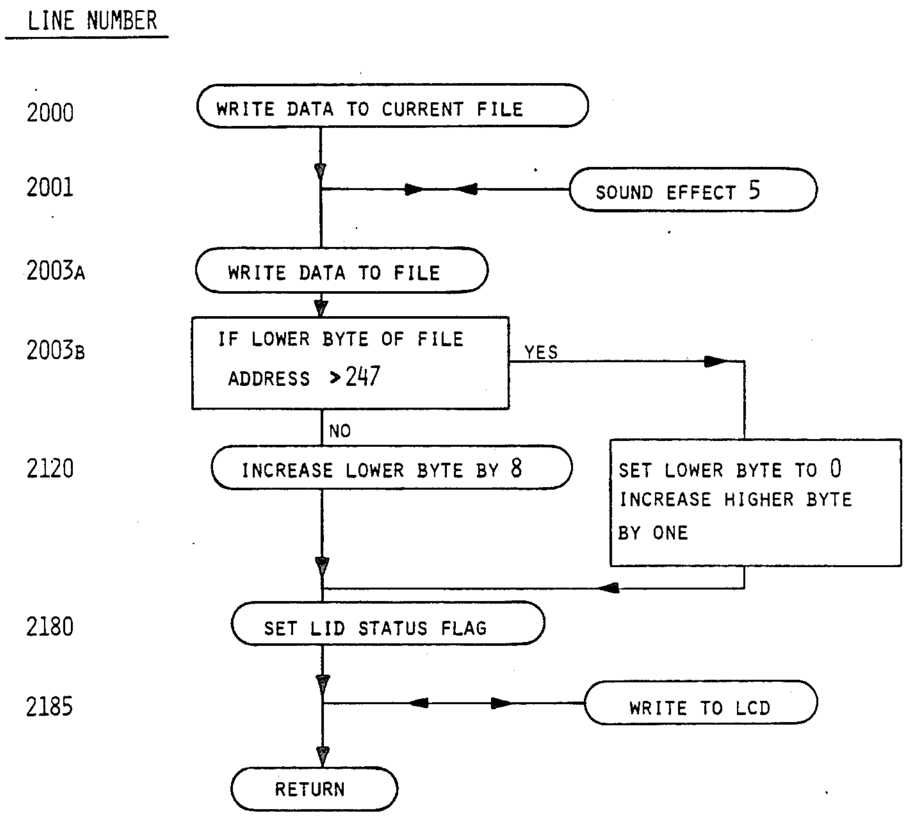
Figure 16:
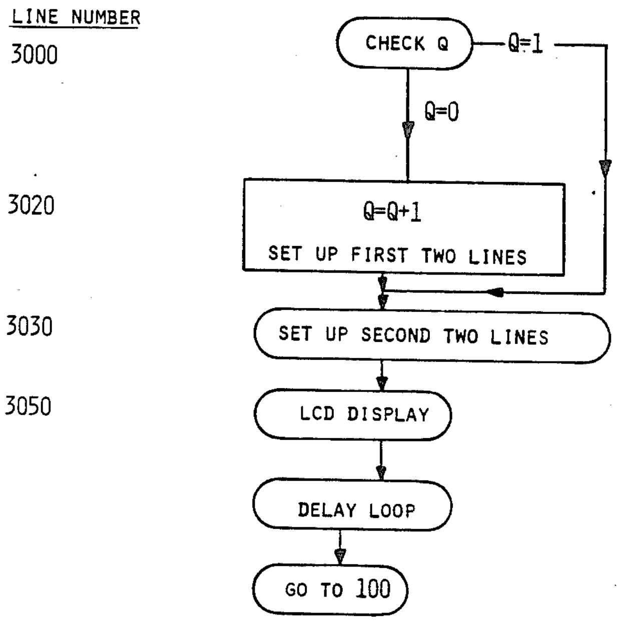
Figure 17:
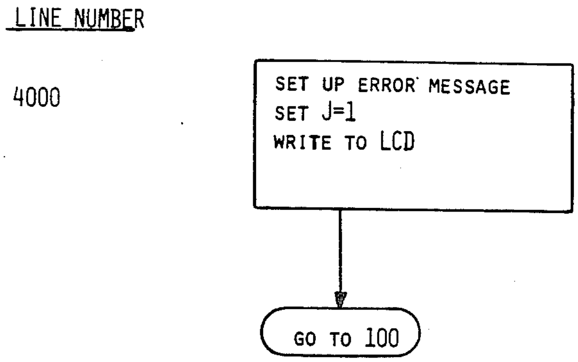
Figure 18:
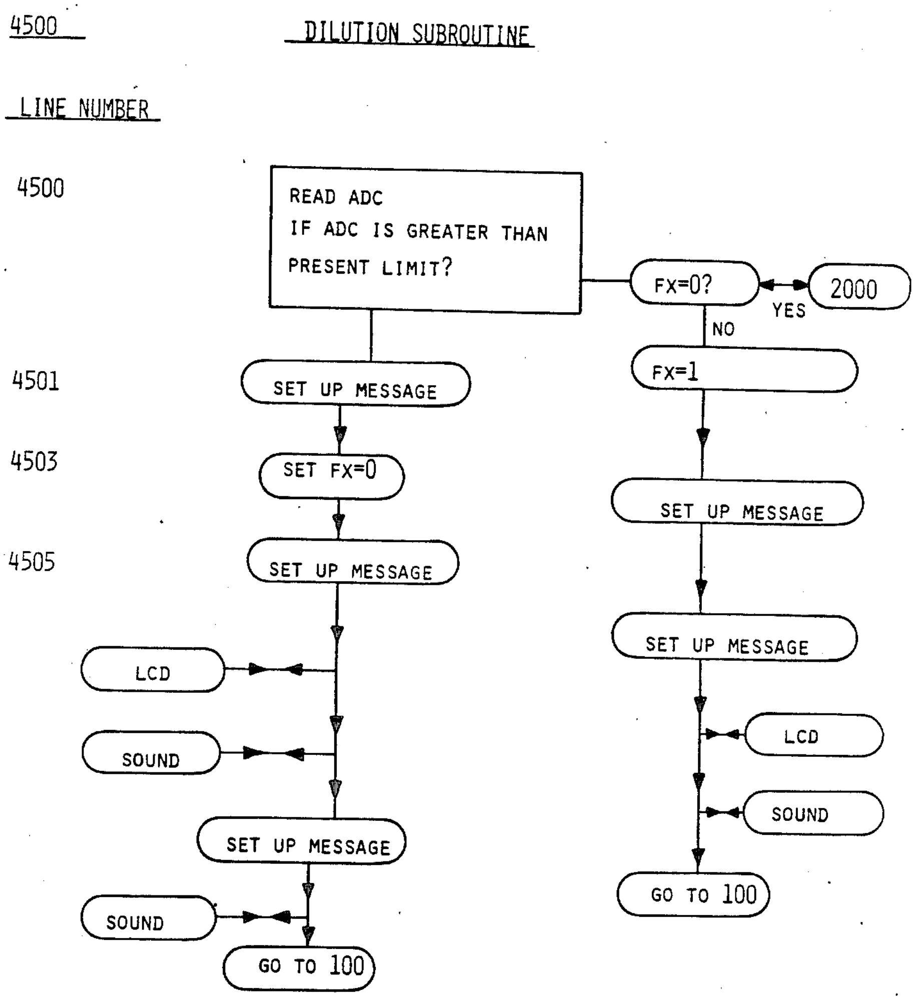
Figure 19A:
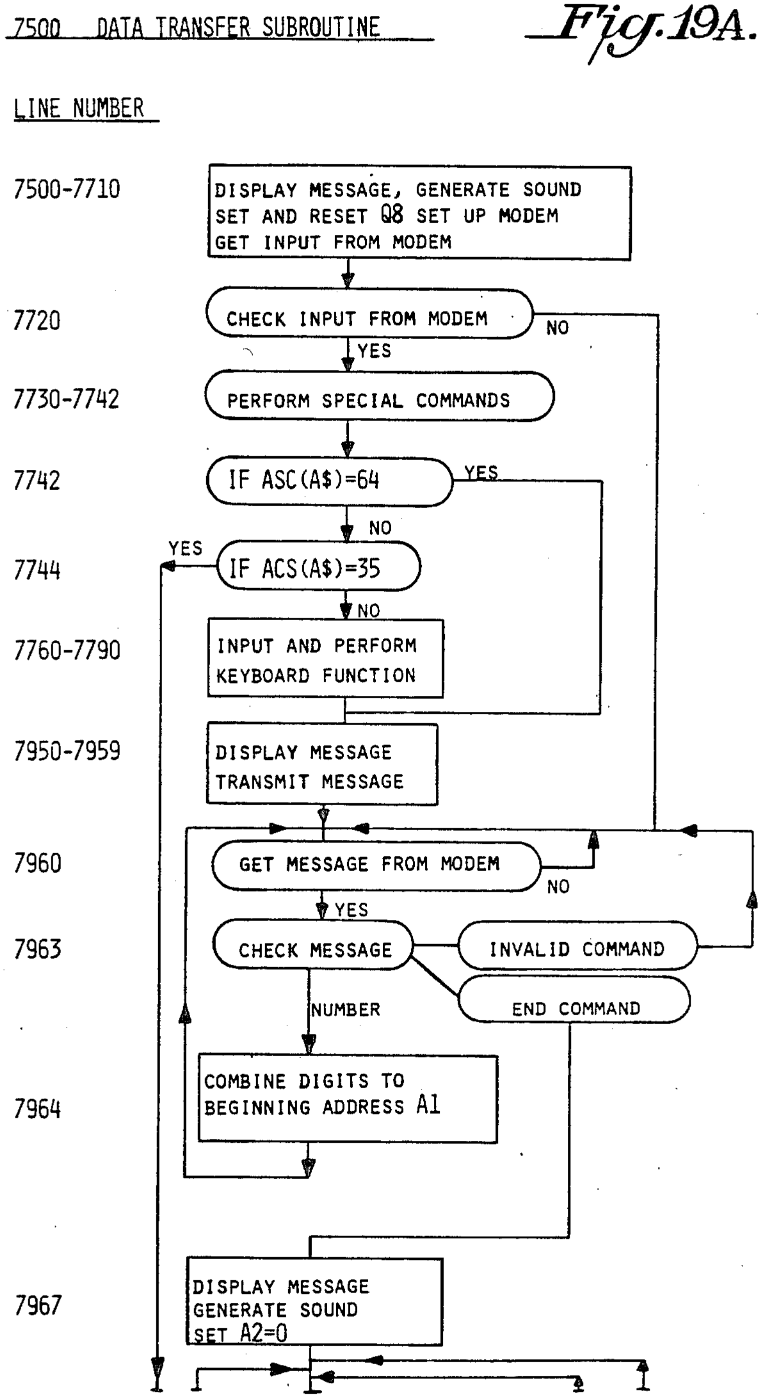
Figure 19B:
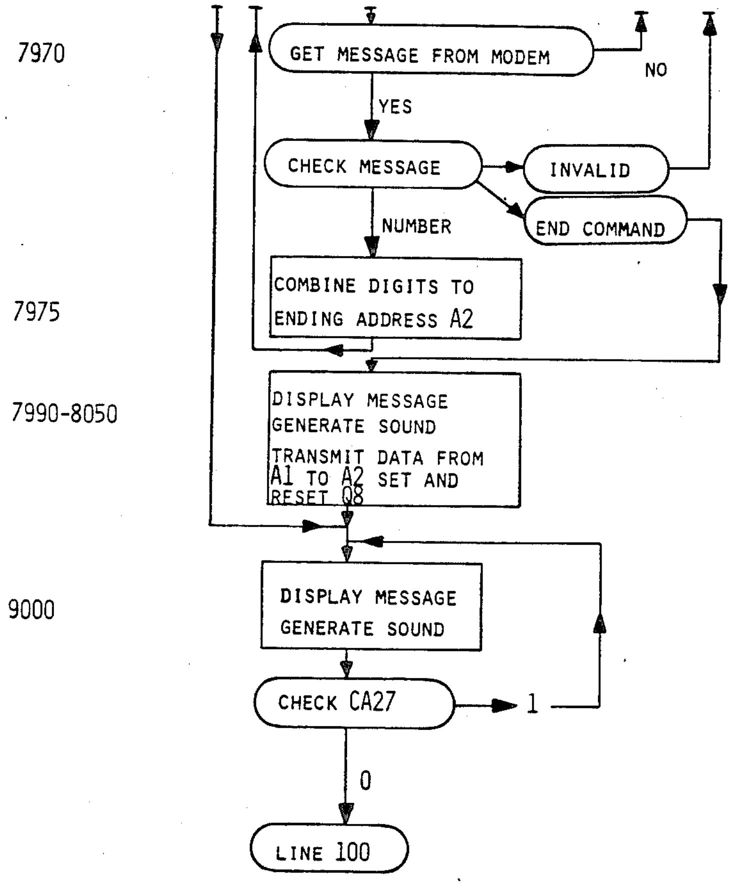

The I/O board may be best seen in FIGS. 11A and 11/B. The board includes a number of integrated logic circuits and gates including memory devices, analog digital converters, storage registers and the like. In particular, the chip IC1 is a TTL logic, chip 74 LS 245 Octal Bus Transceiver which is a bidirectional buffer and signal conditioner for eight data lines. Chip IC2 is a National Semi-Conductor, MM58167 microprocessor compatible real time clock and calendar which provides time and data information so that the expected decay of radioactivity can be calculated. This integrated circuit chip also provides the time and data information of actual material usage. Associated with this chip is a crystal used with the invention that is a 32,768 Hz crystal-controlled oscillator, capacitor $C_1$ is an adjustable capacitor for the crystal, resistor R14 and capacitor $C_3$ are signal filters, resistor R13 and capacitor $C_2$ is a power down sensing circuit, resistor R19 is a pull up resistor for another integrated circuit to maintain a logic "1" for IC2 in a power down condition and BUP input is a backup power from battery $B_1$ to keep the clock IC2 running in a power down condition.

IC3 is a National Semi-Conductor ADC0804 8-bit analog to digital converter which functions to convert the analog signal from the radiation detecting circuit to an 8-bit digital signal accessible by the host computer 28. A reference potential of 2.5 volts is provided by $R_{15}$ and a zener diode. Integrated circuit chips IC4, IC5 and IC6 are Motorola MCM2716 2048×8-Bit UV erasable programmable read only memory (PROM) chips that provide 6-K bytes of software program for the recorder. A CMOS RAM 6516 chip IC7 provides 2-K bytes of data storage for machine identification, and up to 254 files of isotope usage data. This chip is powered by BUP which will retain the data in this chip during power down. This chip will also be deselected by connecting $R_4$ to BUP during power down.

A TTL logic 74 LS 156 with an open collector address decoder decodes signals from $A_{11}$ and $A_{12}$ and memory block select line BLK5 for integrated circuit chips IC4, 5, 6 and 7.

Chips IC9, 10, 11 and 12 are tri-state octal bus transceivers for 32-bits of digital input data from the CAL-CARD and lid condition sensor lines in FIGS. 2 through 6.

A TTL 74 LS 373 octal D-type latch is used for IC13 and provides 8 bits of digital output signal to drive the LED indicators and automatic reset circuit (IC16).

The chip IC14 is a TTL 74 LS 156 address decoder and functions to decode $A_0$, $A_6$, $A_7$, $A_8$ and I/O 3 lines for the chips IC9, 10, 11, 12, 13, 2 and 3.

A TTL 74 LS 221 monostable multivibrator is used for IC15 and functions to provide proper timing signal for the LCD display circuits.

Chip IC16 is a timer NE 555 configured as a "Missing Pulse Detector". $R_{16}$, $R_{19}$ and $C_7$ set up this IC as a multivibrator with a 2 minute off-time and a 30 second on-time. Capacitor $C_7$ is in parallel with transistor $T_1$. In a normal operating cycle, a pulse is commanded by software to be sent from IC13 to the base of $T_1$. This pulse will cause the charge built up in $C_7$ to discharge via the emitter and collector of $T_1$. In a normal operating cycle, one pulse per minute is expected from IC13 and will keep $C_7$ from building up charge to $\frac{2}{3}$ of Vcc. In case of momentary software or hardware failure which cause the normal program cycle to stop, $T_1$ will not receive pulse from IC13 and within 2 minutes, $C_7$ will build up charges to $\frac{2}{3}$ Vcc level and cause the output from pin 3 of 555 to go low. This output pulse (from pin 3) will couple via $C_{12}$ to reset the host computer and re-initiate the main program.

BLK5 line which will address 9C00-9DFF and A000-BFFF memory locations respectively when the line goes low. This board is also connected to the PHASE-2 clock signal and the RESET line of the computer.

The data transfer direction of IC1 is controlled by the signal at pin 1 which is connected to the read/write line. In write mode, data D0-D7 from the computer are transferred to D0'-D7' DATA BUS which are connected to on-board memories IC4, IC5, IC6, $IC_7$, clock IC2, ADC IC3, Digital Input Devices IC9, IC10, IC11, IC12, Output Device IC13, and LCD. In read mode, data in the DATA BUS will be transferred to the computer BUS D0-D7. IC1 is active only when address groups between A000-BFFF or 9C00-9DFF are called, i.e. when either BLK5 line or I/03 lines goes low which will cause the output (pin 3) of inverter IC18*a* to go high and in turn causes output (pin 6) of inverter IC19*c* to go low. When IC1 is not active, (pin 19 high), all data lines of IC1 are in high impedance state and will have no effect on the computer DATA BUS or on any devices on the I/O BOARD.

All devices in the I/O BOARD can be regarded as memory locations to the computer. IC8 decodes A11, A12, and BLK5 lines in the following ways:

| BLK5 | A11 | A12 | L0 | L1 | L2 | L3 |
|---|---|---|---|---|---|---|
| L | L | L | L | H | H | H |
| L | H | L | H | L | H | H |
| L | L | H | H | H | L | H |
| L | H | H | H | H | H | L |

where H, L, X are logic high, low, and "don't care" respectively. With this decoder, IC4, IC5, IC6, and IC7 will be addressed when locations A000-A7FF, A800-AFFF, B000-B7FF, and B800-BFFF are called respectively. Address lines A0 to A10 are connected to these four devices to further select the individual memory cells. IC14 and IC18b decode lines I/03, A0, A6, A7, and A8 in the following way:

| A0 | I/03 | A6 | A7 | A8 | V0 | V1 | V2 | V3 | V4 | V5 | V6 | V7 |
|---|---|---|---|---|---|---|---|---|---|---|---|---|
| L | X | X | X | X | H | H | H | H | H | H | H | H |
| H | H | X | X | H | H | H | H | H | H | H | H | H |
| H | L | L | L | L | L | H | H | H | H | H | H | H |
| H | L | H | L | L | H | L | H | H | H | H | H | H |
| H | L | L | H | L | H | H | L | H | H | H | H | H |
| H | L | H | H | L | H | H | H | L | H | H | H | H |
| H | L | L | L | H | H | H | H | H | L | H | H | H |
| H | L | H | L | H | H | H | H | H | H | L | H | H |
| H | L | L | H | H | H | H | H | H | H | H | L | H |
| H | L | H | H | H | H | H | H | H | H | H | H | L |

An Intersil 7660 voltage converter forms the chip IC17 and converts +5 volts to −5 volts for the viewing adjustment circuit of the LCD.

A TTL 74 LS 00 quadruple 2-input positive—NAND GATES constitutes the chip IC18.

The chip IC19 is a TTL 74 LS 04 hex inverter, chip IC20 is a TTL 74 LS 02 quadruple 2-input positive—NOR GATES.

I/O BOARD FUNCTION

This board is connected to a host computer 20 with 16 address lines (A0 to A15) and 8 data lines (D0 to D7) both with positive logic (high—1, low—0). It is also connected to read/write lines CR/W and VR/W which will go "low" when data are sent from host computer to the board and go "high" when data are expected from the board. Furthermore, it is connected to I/03 line and where H, L. X denote high low and "don't care" respectively. With this decoder, devices on the I/O BOARD will have the following address:

| | | |
|---|---|---|
| IC9 V0 ADDRESS: 9C00-9C3F | -- | DIGITAL INPUT FROM CA1-CA8 |
| IC10 V1 ADDRESS: 9C40-9C7F | -- | DIGITAL INPUT FROM CA9-CA16 |
| IC11 V2 ADDRESS: 9C80-9CBF | -- | DIGITAL INPUT FROM CA17-CA24 |
| IC12 V3 ADDRESS: 9CC0-9CFF | -- | DIGITAL INPUT FROM CA25-CA32 |
| IC13 V4 ADDRESS: 9D00-9D3F | -- | DIGITAL OUTPUT TO CA33-CA39 AND Q8 |
| LCD V5 ADDRESS: 9D40-9D7F | -- | LIQUID CRYSTAL DISPLAY -- SEE NOTE A |

-continued

| | | |
|---|---|---|
| IC3 V6 ADDRESS: 9D80-9DBF | -- | ANALOG TO DIGITAL CONVERTER - SEE NOTE B |
| IC2 V7 ADDRESS: 9DC0-9DFF | -- | REAL TIME CLOCK -- SEE NOTE C |

Note A: The LCD used in this machine is a 4 lines by 40 characters device. The first two lines are selected when E1 (from pin 10 of IC20*c*) is high, and the 2nd two lines are selected when E2 (from pin 4 of IC19*b*) is high. Data to be displayed are entered sequentially to the LCD unit when LCD R/W line goes low (from pin 13 of IC20*d*), LCD RS line goes high and E1 or E2 line goes high. Data are interpreted as ASCII code and displayed. In the event when LCD RS line goes low and R/W goes low, display position can be selected by data lines. To conform with the required timing of the device, phase 2 signal and V5 line from IC14 are used to trigger IC15 and in turn generate a pulse with proper timing at Q and Q' output to enable lines E2 and E1.

Note B: When selected (low signal in CS' line), conversion cycle will be started when W goes low. Digital representations of the analog input signal are transferred to DATA BUS D0'-D7' when CS' line and R line are low.

Note C: A1 to A5 further command this device to output the following information:

| | |
|---|---|
| . . . A1 . . . A2 . . . A3 | |
| . . . L . . . L . . . L . . . | SECOND |
| . . . H . . . L . . . L . . . | MINUTE |
| . . . L . . . H . . . L . . . | HOUR |
| . . . H . . . H . . . L . . . | DAY OF WEEK |
| . . . L . . . L . . . H . . . | DAY OF MONTH |
| . . . H . . . L . . . H . . . | MONTH |

The crystal XTAL and R14, C3 and C1 provide a 32,768 Hz time base for the device. This device is backup by BUP line (Power Backup from battery B1) and will remain active during power down.

OTHER DEVICE $IC_7$ converts +5 volt to −5 volt for LCD viewing angle adjustment.

MISSING PULSE DETECTOR IC16, $T_1$

IC16, a NE555 timer is configured as a multivibrator with 90 second on-time and 30 second off-time. In this circuit, capacitor $C_7$ is charged via R16 and R19 from zero volt to 3.33 volts during power up. A negative going pulse from Q8 line (IC13) will cause the base of transister $T_1$ to go low and thus discharges charges built up in $C_7$. If negative going pulses are sent from Q8 to $T_1$ with intervals of 60 seconds or less, $C_7$ will never build up charges above the 3.33 volts level and IC16 will never change state. In the event that no pulse is received from line Q8 for more than 120 seconds, $C_7$ will charge up to 3.33 volts and cause the output (pin 3) of IC16 to go low and send a negative pulse to the RESET line. This action will cause the computer to re-start and program from the beginning. In the normal operating mode, a negative going pulse from Q8 line is ordered by the program with intervals equal to or less than 60 seconds. In the event that the normal program is interrupted or halted by unexpected operation, the missing pulse from Q8 will cause IC16 to generate a RESET pulse and re-start the program.

The CAL-CARD is an edge-board connector that provides the inputs CA1–28 to the I/O circuit 26. The isotope container sensors 84, 86, 88 and 90 provide outputs for lines CA29–32. Line CA is a logic "1" indicating that the knob is rotated to the dilution mode; CA30 is a logic "1" denoting that the knob is in the calibrate position and CA28 is in the logic "0" to indicate that the knob is in the normal operation position.

Line CA31 senses the presence of the CAL-CARD by a logic "1" and CA32 is connected to the sensor and emits a logic "1" signal when the lid is open. Thus the user now may shift the knob to the calibrate position to permit the machine to calibrate itself and thence back to the normal position so that the machine is in a dispensing mode. When it is desired that he withdraw a radioactive material, he lifts the lid (this is sensed by the lid sensor), the sample is withdrawn, and the lid is closed.

SYSTEM OPERATION

When the dispenser at the user location is connected to A.C. power, the computer will go through the normal startup routine as programmed in its internal system ROM and then instruct the user to "PLEASE INSERT CAL-CARD INTO SLOT". The customer will then insert the CAL-CARD enclosed in the current thallium shipment from the supplier, open the lid, place the thallium vial into the shielded chamber, and close the lid. The LCD will then display the current time, measure activity, CAL-CARD information, and material status. The opening and closing of the lid will be sensed by the computer and the measured radioactivity, current time, inserted CAL-CARD information and the status of the sensor will be recorded in the first file of eight-memory locations. At a later time, when the lid is opened by the customer to dispense thallium, the lid sensor will again be activated and a new set of measured radioactivity, time, date, CAL-CARD information and sensor status will be recorded in file No. 2. This action is repeated every time the lid is opened or closed. In addition, every day at periodic intervals, occurring at midnight, 6:00 A.M., 12 noon, and 6:00 P.M., a complete set of information regarding radioactivity, time, etc. will be recorded into the next available file.

When and if the user determines the remaining radioactive material in the vial is too little or too weak, he must dispose of the expired material. To do this he turns the knob to "DILUTION" position. The LCD will then display a message instructing him to "PLEASE DILUTE VIAL WITH LIQUID AND CLOSE THE LID". The user will then inject water into the vial until dilution is sensed via the second bore. The message "DILUTION PROCESS COMPLETED, PLEASE PLACE NEW VIAL INTO LOGGER AND INSERT NEW CAL-CARD" and "TURN KNOB TO NORMAL" will be displayed. If the user turns the knob back to normal position, normal operation will be resumed.

Once every few days the home base computer will contact the user's dispenser telephone number. The telephone ring signal will activate the internal modem and switch the program to data transfer mode. Upon receiving the start data transfer code, starting address, and ending address, data content between these addresses will be transmitted in ASCII code via the modem and telephone line to the home base computer will then calculate the usage of radioactive material at the user location and print out a bill and send to the customer.

To accomplish billing the computer, based on the known decay rate of the radioactive material and the time between measurements calculates the expected value of radiation in the next file. If the expected value is greater than the recorded value, a withdrawal of radioactive material is indicated. The amount is multiplied by price and an increment of the bill created. This calculation is repeated for each withdrawal.

DESCRIPTION OF FLOW CHART

The operation of the system may best understood in conjunction with the flow chart which appears in FIGS. 12 through 20.

LINE 0: Set up the OPERATING SYSTEM to start to execute program from external memory located at A000–B7FF.

LINE 5–70: Set up constant, initialize LCD, set up variable dimensions, read constants into files, read number of days in each months, month in English, weekdays in English, and define function to convert clock number to conventional number.

LINE 80: Jump to subroutine (line 1500) to generate a one beep sound to signal start of program.

LINE 100: Beginning of normal main loop. Sent a pulse to Q8 of IC13 to reset "TIME-OUT" TIMER.

LINE **100*b*–170: Read clock, convert number to decimal, and store as variable array. Read CA1 to CA32** and store in data array.

LINE 175: Check bit 3 of the fourth group (CA27 line), if line CA27=1 (high) then jump to subroutine 7500 for TELEPHONE DATA TRANSFER. CA27 is connected to a switch which is open (high state) when data transfer is requested. If CA27=0 (low) then continue to line 180.

LINE 180: Check line CA31. CA31 is connected to the CAL-CARD input connector and is shorted to ground (low state) via the CAL-CARD. If the CAL-CARD is not inserted, line CA31 will be open and be in logic 1 state (high). If CA31=1 then jump to subroutine starting line 3000 to display MESSAGE 1 and then return to line 100. This loop will continue until the CAL-CARD is inserted.

LINE 200–511: Clock reading and information and status information from CAL-CARD (CA1–CA32) are converted to current TIME, DATE, MILLICURIE OF ISOTOPE, and CALIBRATION DATE. This set of information is also arranged in a STRING for LCD display.

LINE 552: Set up a STRING for LCD display.

LINE 565–662: Convert signals from CA10–CA16 (determined by information from CAL-CARD) to MILLICURIE SHIPPED. Convert calibration date into day of year, convert current date into day of year, time difference between isotope calibration and current time. Calculate expected decay faction with the equation:

TL=0.01* INT (100* EXP (0.009495*DT))

where DT is the difference between cal. time and current time in house, 0.009495 is the isotope decay constant (in this case, THALLIUM-201) and TL is the expected concentration of the isotope. (INT and EXP are standard BASIC PROGRAM notation).

A start ADC conversion pulse is sent in line 650 to IC3 followed by a ADC read command. The value read is converted into MILLICURIE MEASURED by revising it with a reset scale factor. The content of memory location 47104 and 47105 (in I/O board RAM—current file location pointer) are read and stored as a variable NA.

LINE 665: The MILLICURIE MEASURED is compared with MILLICURIE SHIPPED. If they are within the reset variation limit, then the program will continue to line 700. Otherwise, it will jump to subroutine 4000 to change the STRING to an error message.

LINE 700–840: Continue to set up STRING for display information. If current time is equal to one of the four preset times (in this case, 0:00 AM, 6:00 AM, 12:00 PM, and 6:00 PM), then jump to subroutine 2000 and record current information to current file (contained in I/O BOARD RAM, $IC_7$), otherwise, continue to line 843.

LINE 843: Set the LID STATUS FLAG to be 1 for lid "closed" and 0 for lid "opened". If the FLAG STATUS is equal to the previous value, then continue, otherwise, jump to subroutine 2000 and record current information to files.

LINE 844: Set up display STRING to include "lid" information and jump to subroutine 6400 to write the STRING to the second two lines of LCD.

LINE 845: Check clock, if SECOND changed, then turn the ":" in the time display on and off alternately.

LINE 850: READ IC12. These eight bits contain all the machine status information such as whether or not the lid has opened or closed. If this reading is changed due to the opening or closing of the lid, or turning of the KNOB, then the program will loop back to line 100 and return to this line after appropriate action (such as record current information to file). If line CA29=1 then the KNOB (in the isotope shield and containing unit) is in "DILUTION" position. Jump to subroutine 4500 to display "DILUTION" procedure and handling routine, otherwise continue to line 853.

LINE 853: Read IC12, if line CA30=1, then the KNOB is in "CALIBRATION" position. Jump to subroutine 900 for internal calibration. Otherwise, continue to line 854.

LINE 854: Read IC12, if line CA28=1, then the KNOB is not in the "NORMAL" position. Jump to line 1000 to display message. Otherwise continue to line 855.

LINE 855–856: Set up STRING to contain the current information and jump to subroutine 6500 for LCD display.

LINE 860: Read CLOCK, If MINUTE is current, then loop back to line 845. Otherwise loop back to line 100.

WRITE TO FILE SUBROUTINE . . . STARTING LINE 2000

LINE 2000: Write to current file location NA current ADC reading. Write to location NA+1, MONTH. Write to NA+2. Write to NA+3, HOUR. Write to NA+4, MINUTE.

LINE 2001 Jump to subroutine 1500 to generate a one beep sound signal.

LINE 2003A: Write to location NA+5, status of CA1 to CA8. Write to NA+6, status of CA9 to CA16. Write to NA+7, status of CA25 to CA32.

LINE 2003B: If lower byte of the number NA is greater than 247 then jump to line 2160 to set the lower byte to zero and increase upper byte by one.

LINE 2120: Increase current file address location by 8.

LINE 2160: If the total file number is greater than 244 then loop around and reuse file one.

LINE 2180: Set "LID STATUS FLAG" to reflect the current lid status.

LINE 2185: Enter LID FLAG to display message, write STRING to LCD and return.

SUBROUTINE FOR INTERNAL CALIBRATION . . . STARTING LINE 900

LINE 900: Set up the message "INTERNAL CALIBRATION IN PROGRESS, PLEASE STANDBY".

LINE 902: Write all four lines of LCD.

LINE 904: Generate sound effect (25 beeps) to signal the beginning of the calibration routine. Set and reset bit 8 of IC13 to keep the computer running.

LINE 908: Check CA30 line. This line is connected to a microswitch activated by the KNOB. This line is high when the KNOB is in the CAL position. If this is still high after a delay period, then calibration routine will continue. If this line is low because the user has changed his mind or if the line is just activated by passing, then the program will return to line 100 re-calibration.

LINE 910: When the KNOB is in CALIBRATION position, an internal calibration source of isotope Au-195 is positioned to the radiation detector and thus the ADC reading reflect the strength of this internal calibration source. This line reads the ADC value of the source to internal memory.

LINE 920–930: A new scale factor is calculated from the source ADC value, the difference between current time and the calibration time of the calibration source stored beforehand in location 47109 and 47110 and from the initial source strength stored in location 47111. The equation used in this line is:

Z=INT (255*AD/SS* EXP (−*(Y/184)))

Where Z is the new scale factor, AD is the ADC reading, Y is the time difference between current time and calibration time of the internal source, and 184 is the decay constant of the source Au-198. If some other calibration source is used, such as Co-57, this constant will be changed accordingly.

LINE 940: Set up the message "INTERNAL CALIBRATION COMPLETED, PLEASE TURN KNOB TO NORMAL POSITION".

LINE 945: Jump to subroutine 6400 and 6500 to display message. Generate sound effect (line 1800), set and reset bit 8 of IC13 to keep the program running.

LINE 950: Check if KNOB is remained in the CAL position. If yes, loop back to line 940 to display message again and generate sound effect. If the KNOB has returned to NORMAL position, then loop the program to line 100.

SUBROUTINE TO CHECK KNOB POSITION . . . STARTING LINE 1000

LINE 1000: Set up the message "PLEASE TURN KNOB TO NORMAL POSITION". Write to all four LCD lines, generate a special sound effect (line 1800) and return to line 100.

SUBROUTINE TO DISPLAY TITLE PAGE MESSAGE . . . STARTING LINE 3000

LINE 3000: Check dummy variable Q. If Q=0 then continue. If Q=1 then jump to line 3030.

LINE 3020: Set Q=1, set up the first two lines of messages "NEW ENGLAND NUCLEAR A DU PONT COMPANY. THALLIUM ACTIVITY RECORDING COMPUTER", jump to subroutine 6500 for LCD display.

LINE 3030: Set up the second lines of messages "PLEASE INSERT TL CAL-CARD INTO SLOT. THANK YOU FOR USING NEN THALLIUM". Jump to subroutine 6400 to write to LCD. Delay for 1000 cycles and return to line 100.

SUBROUTINE TO DISPLAY CAL-CARD ERROR . . . STARTING LINE 4000

Line 4000: Set up the message "PLEASE INSERT NEW TL CAL-CARD INTO SLOT", jump to subroutine 6500 to write to LCD and return to line 100.

When the user determines that the displayed radioactivity level is below that or its age is greater than that which will provide clinical accuracy, he will then shift the unit to the dilution mode, open the lid, insert water into the container for the isotope until the liquid crystal display indicates that the dilution is complete, at which time he is in a position to remove the card and the then spent container and insert a new container and its corresponding CAL-CARD for a new sequence of operation.

DILUTION SUBROUTINE . . . STARTING LINE 4500

LINE 4500: At this moment, the KNOB is in the DIL position and the internal collimator is opened to the upper part of the vial containing the isotope above the normal level. Therefore no radiation is expected to pass through the collimator and be detected. However, if the isotope is diluted and the level raised above the normal level and into the view of the collimator, a radiation level will be detected and the ADC value will be above the normal limit of noise. This line checks the ADC value. If it is above the noise limit, then jump to line 4700.

LINE 4501 to 4580: "Set up the message "THANK YOU FOR USING NEN THALLIUM BEFORE DISPosING OF THE UNUSED THALLIUM, PLEASE DILUTE VIAL WITH LIQUID, PLACE VIAL BACK TO LOGGER AND CLOSE LID". Set FLAG FX=0, jump to line 6500 to display message, delay for 6000 cycles and replace the message by "IF YOU DETERMINE TO USE THE REMAINING THALLIUM, PLEASE TURN KNOB BACK TO NORMAL POSITION AND RESUME NORMAL OPERATION. Jump to subroutine 6400 for LCD display. Generate sound effect delay for 6000 cycles and return to line 100.

LINE 4700: If FX=0 then jump to file writing subroutine 2000 and set FX=1.

LINE 4710: At this moment, radiation is detected through the collimator indicating that isotope fluid level in the container is above the normal shipping level and the isotope has been diluted to clinically unusable dilution. In this line, the message "DILUTION PROCESS COMPLETED, PLACE NEW THALLIUM INTO LOGGER, INSERT NEW THALLIUM CAL-CARD INTO SLOT, TURN KNOB TO NORMAL AND CONTINUE" is set up and jump to subroutine 6500 and 6400 for LCD display. SUBROUTINE FOR LCD DISPLAY . . . LINE 6400 AND LINE 6500

LINE 6500: Messages set up in the A$ STRING and B$ STRING are translated into ASCII codes and write to LCD sequentially for first two lines of display.

LINE 6400: E2 line of LCD is set high and continued with line 6500, thus the second two lines of display is used for A$ STRING and B$ STRING.

SUBROUTINE FOR TELEPHONE DATA TRANSFER . . . STARTING LINE 7500

LINE 7500 TO 7710: At this moment, the DATA TRANSFER SWITCH is turned on and causes CA27 line to go high. In these lines, the message "READY FOR NEN DATA TRANSFER, PLEASE REMOVE PLUG FROM TELEPHONE AND CONNECT THE LINE TO LOGGER AND STANDBY" is set up and jump to subroutine 6500 and 6400 for LCD display. Five beeps signal are generated and Q8 of IC13 is set and reset to keep the program going. Constants are entered into modem transmitting and receiving matrix and look for input characters from the modem.

LINE 7720: If nothing is detected from the input of modem, then jump to 7760, otherwise, continue.

LINE 7730-7744: If signal received is a diagnostic signal then command diagnostic screen to follow commands. (Monitor screen is only connected to the unit in service mode). If the signal received is a START TO TRANSFER code, (ASCII 64) then jump to line 7950. If the signal received is an END OF DATA TRANSFER code, (ASCII 35), then jump to line 9000. If signal received is none of the above, then loop back to line 7710 to look for another modem input signal.

LINE 7760–7790: These lines are for machine diagnostic and manual communication with the homebase computer only. A keyboard can be connected to the unit and exchange information with homebase computer. This line looks for keyboard input. If keyboard signal exists, then send signal via modem, otherwise, loops back to line 7710.

LINE 7950–7960: At this moment, a START TO TRANSFER command is received from the home base computer. Set up and display in LCD the message "DATA TRANSFER FROM". Transmit the message "READY FOR DATA TRANSFER" via modem to the home-base computer. Generate a one beep sound signal. Set $A1=0$ and wait for more input from modem.

LINE 7963: At this moment, the program will only accept numerical ASCII codes or an END ADDRESS command. If the code received is an END ADDRESS command then jump to line 7967, if the code is numerical, then continue, otherwise, loop back to line 7960.

LINE 7963–7964: Convert ASCII to digit and loop back to line 7960 for more numbers to build up the complete BEGINNING ADDRESS, A1.

LINE 7967–7969: Send the message "BEGINNING ADDRESS RECEIVED" to LCD DISPLAY and generate one beep sound. Set $A2=0$ and wait for modem input.

LINE 7970: If modem input is "START TRANSMITTING" code, then jump to line 7990. If the input is not numerical, then continue to wait.

LINE 7975: Convert code to ENDING ADDRESS, A2.

LINE 7980–7982: For keyboard address diagnostic input only.

LINE 7990–8050: Display the message "ENDING ADDRESS RECEIVED, DATA TRANSFER STARTED, PLEASE STANDBY" in LCD. Generate an one beep sound. Set and reset bit 8 (Q8 of IC13 and transmit memory contents of A1 to A2 in ASCII code via the modem. Set and reset Q8 and generate an one beep sound after transmitting every eight numbers.

LINE 9000–9090: At this moment, all data between A1 to A2 have been transmitted. Display the message "DATA TRANSFER COMPLETE, PLEASE RECONNECT TELEPHONE LINE, THANK YOU FOR USING NEN THALLIUM, DIAL L-800-225-1572 FOR ANY INFORMATION" on LCD, generate a sound effect with subroutine 1600, set and reset Q8 and check CA27. If CA27 is low (not requesting for data transfer) then loop back to line 100. Otherwise loop back to 9000.

Figure 20A:
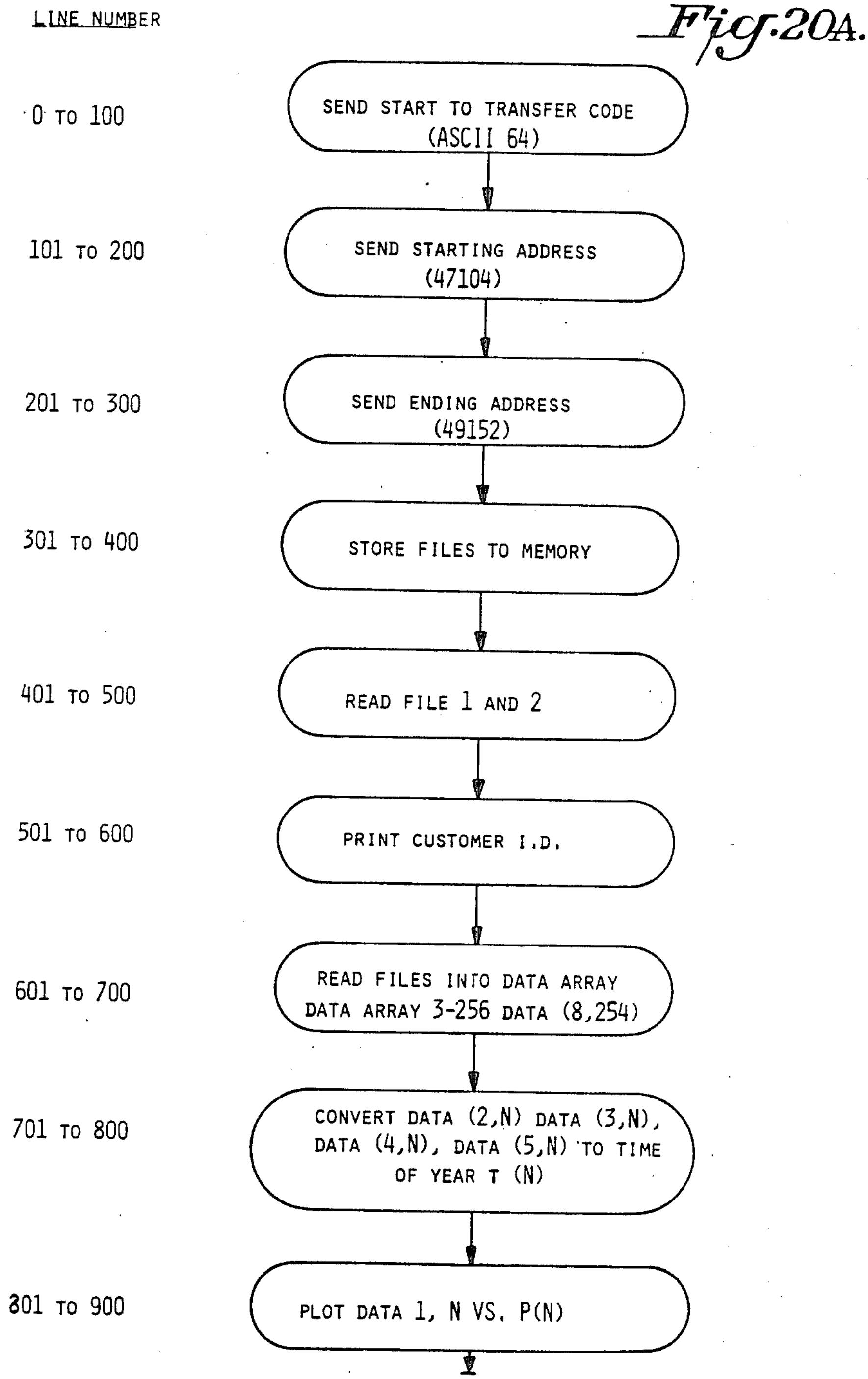
FIGS. 20A & B are flow charts depicting the billing sequence at the billing computer.
Figure 20B:
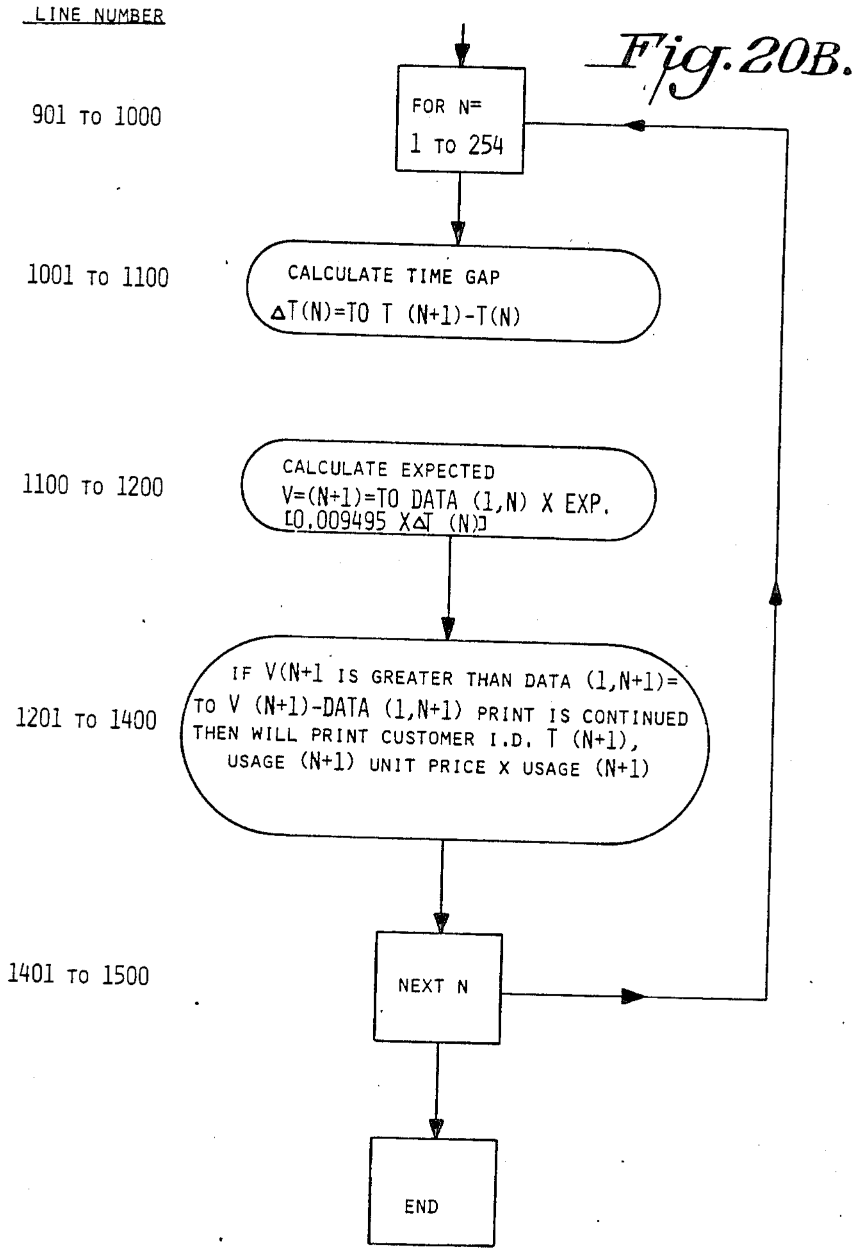

At the homebase or billing computer 34 (FIG. 1) the computer operates according to the flow chart of FIGS. 20*a&b*. The starting code line is line 100 and is initiated once telephone conact is made. At this moment data transfer begins and upon completion of data transfer, the HBC will display and plot the recorded activity verses time as shown in GRAPH 1. Any downward step apart from the normal exponential decay curve of the expected isotope will be regarded as withdrawl of activity and the size of the downward step will signify the amount withdrawn. This time and amount withdraw information will be printed by the billing computer and a bill will be generated according to this information and sent to the customer.

This process is explained in greater detail by reference to FIGS. 20*a&b*. Thus:

Line 0–100: The billing computer transmits the start to transfer code through modem 33 to command the customer unit from the beginning of transmission. Line 101–200: Next there is transmitted a starting address code and in Line 201–300 there is transmitted an end of address code.

Line 301–400: Next the transmission from customer's unit is received and installed into home base computer memory.

Line 401–500: With the data stored it is now ready to process the data. First files 1 and 2 are read to obtain customer identification information.

Line 501–600: The customer I.D. information is printed.

Line 601–700: Next there is created a data array of $8\times254$ to organize the transmittal data.

Line 701–800: Then the date of month information, hour and minute of file No. N is converted to absolute time of year in hours called T (N).

Line 801–900: The plotter generates a graph of Data of the measured radioactivity vs. T (N).

Line 901–1000: Next a loop is established to calculate certain items for each file, i.e., each radioactivity measurement.

Line 1001–1100: First we calculate the time gap between successive files.

Line 1101–1200: Then the expected value of the next file is calculated according to material radioactive decay constant of the isotope.

Line 1201–1400: If the expected value is greater than recorded value of the next file than this will signify a withdrawal of the radioactive material, the customer I.D., time of withdrawal, amount of withdrawal and cost of material will be printed in a bill.

Line 1401–1500: Continue to do line No. 10 until all the files, i.e., all material withdrawals have been calculated.

Program listings in Basic implementing these flow charts may be found in the Application File.

The system thus described represents a significant improvement over that available in the prior art. With this system, relatively large quantities of radioactive material may be shipped at a given time and the user billed only for that which he actually uses. This saves considerably in transportation costs, and at the same time renders it possible for the user to always be in possession of sufficient material, without having to await a reorder of one or two dosages on as needed basis.

What is claimed is:

1. A system for billing based on the usage of radioactive material held in a dispensing container comprising:

a radiation shielded chamber adapted to receive the container, a sensor for providing a signal each time the chamber is accessed, a detector means for detecting radiation emitted from the container while in the chamber, a control unit responsive to the sensor and detector means for measuring the level of radiation in the container (a) periodically and (b) each time the chamber is accessed, memory means responsive to the control unit for storing each of the radiation measurements together with the time of the access event, and means responsive to the control unit and memory means for calculating the radioactive material actually removed from the container based on the periodic and access measurements.

2. A system for billing as set forth in claim 1 which includes an identification member for each container holding information as to the type of material and shipped radiation level of that container, reader means for ascertaining the information in such member, means responsive to the reader means for transferring such information to the control unit to determine if the initial radiation level in the container is appropriate based on the shipped radiation level.

3. A system as set forth in claim 2 where the detector means includes an activity means for measuring the radiation emitted from the lower portion of the chamber, and dilution means for measuring the radiation emitted from the upper portion of the chamber, the control unit responsive to the radiation emitted from the upper portion of the chamber being greater than a predetermined level to signal a spent container and discontinue measuring radiation emitted from the container.

4. A system as set forth in claim 3 wherein the chamber has a lid that can be opened to provide access to the chamber, the sensor detecting the opening of the lid.

5. A system as set forth in claim 3 wherein the chamber is a cylindrical cavity defined by a block and the radiation detector is located in the lower portion of the block, the block defining first and second bores communicating with different portions of the chamber and the radiation detector, a drum means positioned in the path of the bores and being selectively rotatable to close one end or the other of the first and second bores.

6. A system as set forth in claim 5 wherein the first bore communicates with the bottom of the chamber and the second bore communicates with a portion of the chamber above the bottom.

7. A system as set forth in claim 6 wherein the drum also defines a cavity containing an internal calibration source.

8. A system as set forth in claim 2 which also includes computer means for billing and means for transmitting such information as to material actually removed to the computer means for billing users for material actually used.

9. A system as set forth in claim 8 where the detector means includes an activity means for measuring the radiation emitted from the lower portion of the chamber, and dilution means for measuring the radiation emitted from the upper portion of the chamber, the control unit responsive to the radiation emitted from the upper portion of the chamber being greater than a predetermined level to signal a spent container and discontinue measuring radiation emitted from the container.

10. A system as set forth in claim 2 where the detector means includes an activity means for measuring the radiation emitted from the lower portion of the chamber.

11. A system as set forth in claim 1 wherein the chamber is a cylindrical cavity defined by a block and the radiation detector is located in the lower portion of the block, the block defining first and second bores communicating with different portions of the chamber and the radiation detector, a drum means positioned in the path of the bores and being selectively rotatable to close one or the other of the first and second bores.

12. A system as set forth in claim 11 wherein the first bore communicates with the bottom of the chamber and the second bore communicates with a portion of the chamber above the bottom.

13. A system as set forth in claim 12 which also includes first sensors for detecting the rotating position of the drum and second sensors for detecting the opening of the chamber all coupled to the control unit.

14. A method of measuring dispensed doses of a radioactive material from a dispensing container adapted to be held in a shielded chamber with a removable access lid using a radiation detector to measure radioactivity in the chamber comprising the steps of:

first measuring the radioactivity in the chamber when a dispensing container is first loaded into the chamber, recording the first measurement and its time and date, second measuring the radioactivity in the chamber each time the lid is removed, recording each second measurement and its time and date, third measuring the radioactivity in the chamber each time the lid restored on the chamber, recording each third measurement and its time and date, and calculating the radioactive material actually used based on such measurements.

15. A method set forth in claim 14 which includes the additional step of periodically measuring the radioactivity in the chamber, recording each such measurement and its time and date, and comparing such periodic measurements with the anticipated radioactive decay of the material to insure against unauthorized usage of the material.

16. A method set forth in claim 15 which includes the initial step of injecting a dilution fluid into the dispensing container at the end of the materials useful life until the detector senses the dilution fluid having reached a predetermined level in the dispensing container indicating a useless concentration for medical purposes.

17. A method set forth in claim 14 which includes the initial step of injecting a dilution fluid into the dispensing container at the end of the materials useful life until the detector senses the dilution fluid having reached a predetermined level in the dispensing container indicating a useless concentration for medical purposes.

18. A method set forth in claim 17 which includes the additional step of transmitting the recorded measurements, time and dates to a billing location, and preparing a billing based on radioactive material actually withdrawn from the dispensing container.

19. A method set forth in claim 14 which includes the additional step of transmitting the recorded measurements, time and dates to a billing location, and preparing a billing based on radioactive material actually withdrawn from the dispensing container.

* * * * *